United States Patent
Rieske et al.

(10) Patent No.: US 11,059,202 B2
(45) Date of Patent: Jul. 13, 2021

(54) METHOD AND DEVICE FOR PRODUCING PLANAR MODIFICATIONS IN SOLID BODIES

(71) Applicant: SILTECTRA GmbH, Dresden (DE)

(72) Inventors: Ralf Rieske, Dresden (DE); Christian Beyer, Freiberg (DE); Christoph Guenther, Dresden (DE); Jan Richter, Dresden (DE); Marko Swoboda, Dresden (DE)

(73) Assignee: Siltectra GmbH, Dresden (DE)

( * ) Notice: Subject to any disclaimer, the term of this patent is extended or adjusted under 35 U.S.C. 154(b) by 154 days.

(21) Appl. No.: 16/067,946

(22) PCT Filed: Dec. 12, 2016

(86) PCT No.: PCT/EP2016/080667
§ 371 (c)(1),
(2) Date: Jul. 3, 2018

(87) PCT Pub. No.: WO2017/118533
PCT Pub. Date: Jul. 13, 2017

(65) Prior Publication Data
US 2019/0366586 A1 Dec. 5, 2019

(30) Foreign Application Priority Data

Jan. 5, 2016 (DE) ...................... 10 2016 000 051.1

(51) Int. Cl.
*B23K 26/03* (2006.01)
*B23K 26/36* (2014.01)
(Continued)

(52) U.S. Cl.
CPC ............ *B28D 5/0011* (2013.01); *B23K 26/36* (2013.01); *B23K 2103/166* (2018.08)

(58) Field of Classification Search
CPC ............................................. B23K 26/03–0344
See application file for complete search history.

(56) References Cited

U.S. PATENT DOCUMENTS 7,726,532 B2  6/2010  Gonoe
8,835,802 B2  9/2014  Baer
(Continued)

FOREIGN PATENT DOCUMENTS

CN   1998071 A    7/2007
CN   102271858 A  12/2011
(Continued)

OTHER PUBLICATIONS

International Search Report Translation of corresponding PCT application—PCT/EP2016/080667.
(Continued)

*Primary Examiner* — Michael A Laflame, Jr.
(74) *Attorney, Agent, or Firm* — Murphy, Bilak & Homiller, PLLC

(57) ABSTRACT

A method for creating modifications in a solid-state material is described, wherein a crack guidance region for guiding a crack for separating a solid-state layer from the solid-state material is predetermined by the modifications. The method includes: moving the solid-state material relative to a laser processing system; successively emitting a plurality of laser beams from the laser processing system to the solid-state material to create at least one modification within the solid-state material; and continuously adjusting the laser processing system for defined focusing of the plurality of laser beams and/or for adjustment of energy of the plurality of laser beams as a function of at least one parameter.

10 Claims, 7 Drawing Sheets

Figure 1:
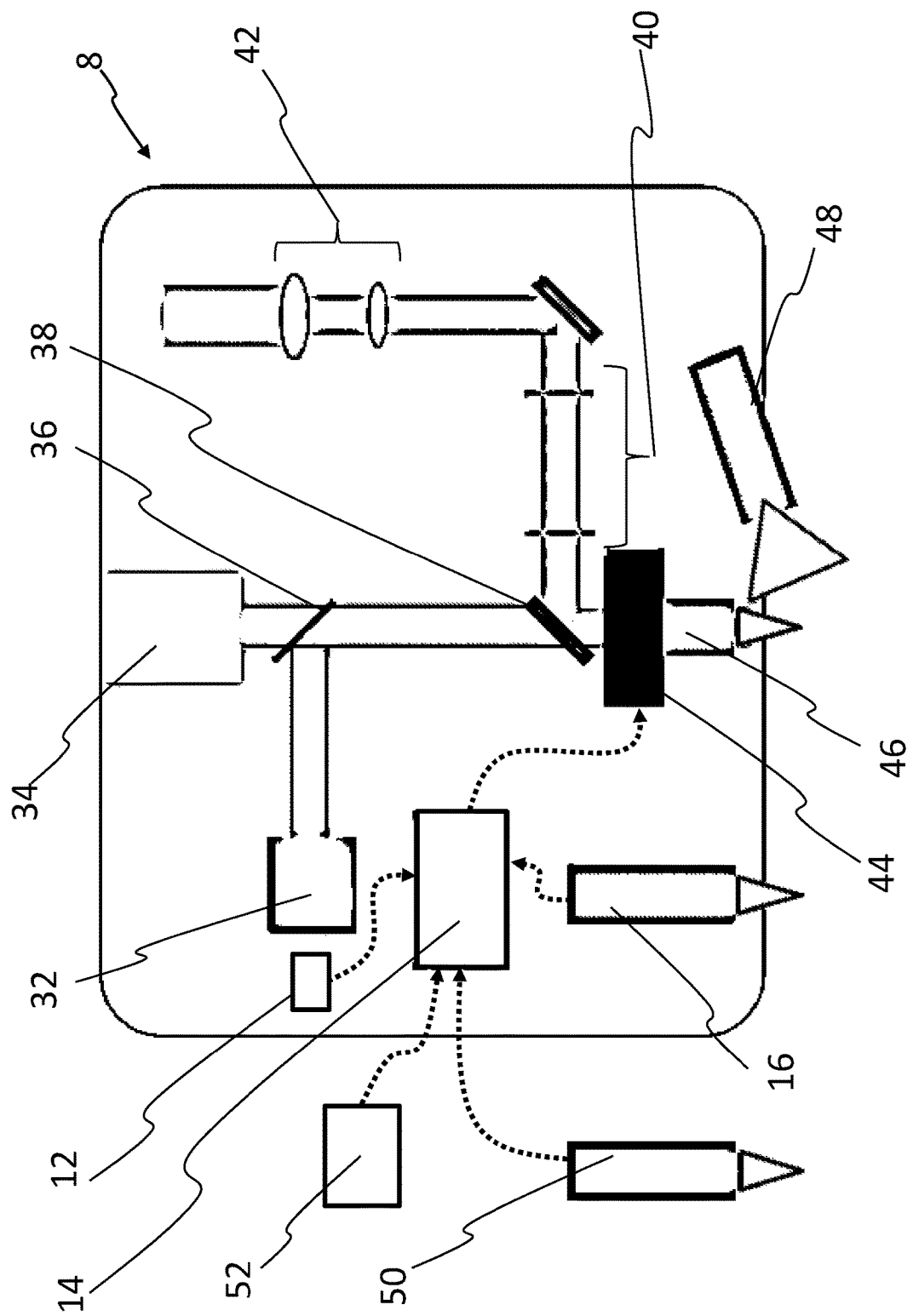

(51) Int. Cl.
    *B23K 26/40*     (2014.01)
    *B28D 5/00*     (2006.01)
    *B23K 103/16*     (2006.01)

(56) References Cited

U.S. PATENT DOCUMENTS

| | | | |
|---|---|---|---|
| 2006/0219673 A1* | 10/2006 | Varnham | B23K 26/0734 |
| | | | 219/121.6 |
| 2013/0068738 A1* | 3/2013 | Schurmann | B23K 26/03 |
| | | | 219/121.72 |
| 2014/0038392 A1 | 2/2014 | Yonehara et al. | |
| 2015/0343562 A1* | 12/2015 | Hirose | B23K 26/55 |
| | | | 264/400 |
| 2017/0365476 A1* | 12/2017 | Mazur | H01L 21/2686 |

FOREIGN PATENT DOCUMENTS

| | | |
|---|---|---|
| CN | 102325717 A | 1/2012 |
| CN | 102905841 A | 1/2013 |
| DE | 10 2010 020183 | 11/2011 |
| EP | 1 338 371 | 8/2003 |
| EP | 2 687 317 | 1/2014 |
| JP | H0540089 U | 5/1993 |
| JP | 2005028423 A | 2/2005 |
| JP | 2005294325 A | 10/2005 |
| JP | 2009140959 A | 6/2009 |
| JP | 2013120918 A | 6/2013 |
| JP | 2015074004 A | 4/2015 |
| JP | 2016197699 A | 11/2016 |
| TW | 200933703 A | 8/2009 |
| WO | 2014177721 A1 | 11/2014 |
| WO | 2015/036140 | 3/2015 |
| WO | 2015052216 A1 | 4/2015 |

OTHER PUBLICATIONS

Written Opinion of corresponding PCT application—PCT/EP2016/080667.

* cited by examiner

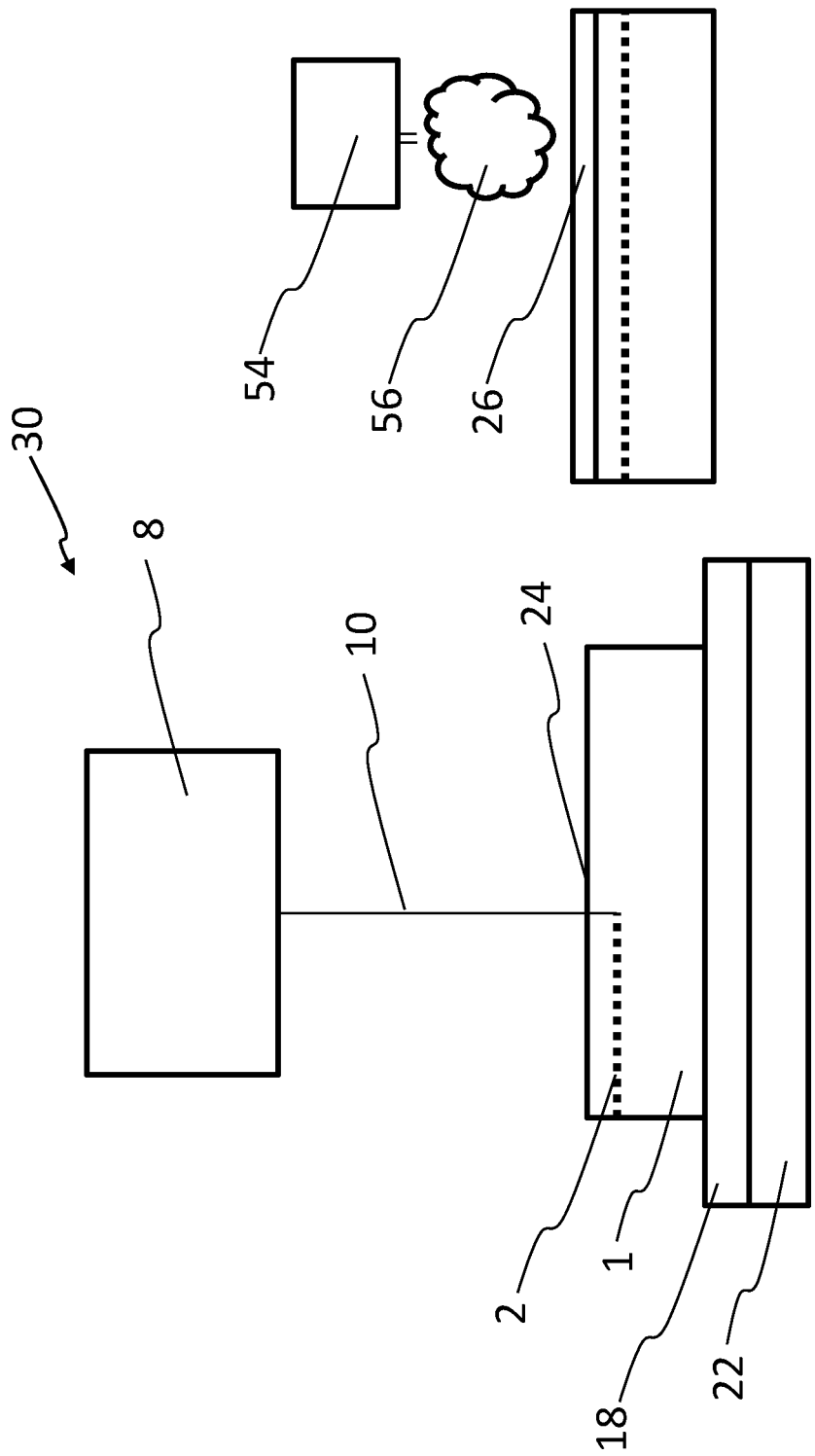

METHOD AND DEVICE FOR PRODUCING PLANAR MODIFICATIONS IN SOLID BODIES

The present invention is in the field of solid-state disk production, i.e., wafer production.

According to claim 1, the present invention relates to a method for creating modifications in a solid state and according to claim 10 it relates to a device for creating modifications in a solid state.

The cold split method (cf. WO2010072675) is a novel method for cutting semiconductor disks (wafers) out of ingots, i.e., boules (semiconductor ingots, depending on the production method—drawing from a melt or vapor deposition from a gas phase). In the cold split method, a laser-damage layer is applied as the intended breaking point in the desired depth through the front face of the semiconductor ingot. A proprietary polymer film having good adhesion is applied and cooled drastically. A semiconductor wafer is formed from the ingot or boule by detachment because of the mechanical stresses caused by the great difference in thermal expansion coefficients.

This is an alternative to traditional cutting of wafers using inner diameter saws or guided wires (diamond-tipped or grinding suspension/slurry). These methods result in a variance in thickness due to wandering of the wires while the wafers are being sliced. As a result of this variation in thickness, the wafers show bulging and bending. Semiconductor manufacturers as further processors of these wafers have accepted these deviations in planarity only to a certain extent. For this reason, after being split off, the semiconductor wafers must be processed by a series of surface treatments. These are done by adjusting the planarity, parallelism and roughness by means of etching, lapping and chemicomechanical polishing steps.

Deviations in surface properties may also occur in the cold split method. These deviations can be removed from the wafer as well as from the ingot by planarization and polishing steps that follow the cold split method.

For wafers, a planar split means less reserve in planarization slicing, which further increases the overall material efficiency of the cold split method in comparison with traditional wafering methods. The total material efficiency is given by the ratio of the wafer thickness used, i.e., the number of defect-free wafers having the final dimension (e.g., 23 wafers of 350 μm thickness=effective thickness 8050 μm) to the initial thickness of the semiconductor ingot (ingot or boule, e.g., 25,000 μm). In this example using a planar laser-modified cold split process, the wafer yield can be increased to 84% versus <40% with the traditional wafering.

Planarity must be restored in the remaining semiconductor ingot before the next lasering operation because otherwise the deviations would propagate throughout the remaining process and might even increase. This increase occurs due to different optical path lengths in materials with a very high refractive index optically (e.g. Si: n=3.6; SiC: n=2.6). Therefore, if the distance from the laser head to the surface fluctuates, then the laser beam will also pass through different optical paths of different refractive indices and different path lengths up to the focus. An error of 1 μm in the distance to the surface thus causes an n-fold error within the material.

To achieve a very high planarity of the laser plane, deviations in the am range are allowed over the length of the wafer, but it is difficult to achieve such deviations with mechanical wedge compensation, which can be achieved only to a limited extent with autofocus alone.

In automatic mask exposure systems, for example, which work with distance lighting (proximity photolithography), mechanical wedge compensation in the am range is state of the art. However, only extremely planar masks and substrates are statically compensated here because the sample does not move in a highly dynamic manner with respect to the processing lens. Only static applications can be implemented by using mechanical wedge compensation and only correction planes (biaxial tilting) can be compensated.

The traditional autofocus maintains a constant distance from the processing lens to the surface. It is also possible in this way to maintain tracking in the laser microprocessing of surfaces in the μm range. In surface processing, the laser naturally runs only through a medium (usually air) up to the focus point. The traditional autofocus has the disadvantage that only tracking of the surface profile is possible. Furthermore, the profile is magnified by the factor of the substrate refractive index, and finally, planarization is impossible.

Furthermore, in addition to mechanical wedge compensation and traditional autofocus, another known method is 3D photolithography with multiphoton absorption and planarization prior to lasering.

The 3D photolithography method with multiphoton absorption greatly resembles laser modification in volume because the focus point here is manipulated in the processing volume while the surrounding material remains unmodified. These processes work with liquid photoresists and therefore yield a surface that is flat and smooth (surface tension, water balance principle). The lens here is manipulated directly in the resist (immersion) and therefore does not undergo any spreading in different media. This method is not advantageous because a system having only a homogenous medium/without an interface is available.

Furthermore, there are planarization and polishing methods, which can produce planarity and roughness of almost any quality. However, the equipment complexity and, associated therewith, the processing costs fluctuate greatly. This method is a disadvantage because an additional reserve of material is required in order to achieve a lower yield or overall material efficiency, which results in increased process costs. Furthermore, there is no saving in terms of the autofocus because placement errors can still be corrected anyway.

The object of the present invention is thus to provide a method and a device which will permit a very precise creation of modifications in the interior of the solid states, even in the case of particularly large solid states having a diameter of more than 6 inches. The solid-state components and/or strata removed from a solid state by means of crack propagation should preferably result in less effort with regard to reworking, i.e., at a distance from the surface of the solid state.

The aforementioned object is achieved according to the present invention by a method according to claim 1. The method according to the invention serves to create modifications in the solid state, wherein a crack guidance region for guiding a crack for separation of a solid-state component, in particular a solid-state layer from the solid state is predetermined by the modifications. The method according to the invention preferably includes at least these steps: moving the solid state relative to a laser processing system, then creating and/or successive emission of a plurality of laser beams by means of the laser processing system for creating at least one modification within a solid state, wherein the laser processing system (8) is adjusted continuously as a function of at least one parameter and preferably as a function of a plurality of parameters, in particular at least two parameters, for defined focusing of the laser beams and/or for adaptation of the laser energy.

This approach is advantageous because it provides a method in which the focus within the material does not directly track the surface but instead is provided with corrections. If these deviations are to be detected in real time, then a simple provision with correction factors can be performed. The correction factors here preferably correspond to the parameters used to adjust the laser processing system.

The position of the focus within a material is also a function of the refractive index and the depth of processing (imaging errors depend on the material).

The method according to the invention can preferably also be understood as a novel control method for focus tracking as a real-time system.

The adjustment of the laser processing system preferably takes place by means of an algorithm executed by a control system, in particular for differentiating substrate tilting due to placement errors (tilting with respect to the machine holders) and/or planarity errors in the semiconductor ingot.

Within the scope of the present invention, a modification is understood to be a change in the lattice structure of the solid state. In particular the change in the lattice structure takes place due to multiphoton excitation.

Additional preferred embodiments of the present invention are the subject matter of the dependent claims and/or of the following parts of the description:

According to a preferred embodiment of the present invention, a first parameter is the average refractive index of the material of the solid state or the refractive index of the material of the solid state is in the region of the solid state that is to be traversed by the laser beams to create a defined modification, and a second parameter is the depth of processing in the region of the solid state that is to be traversed by the laser beams to create a defined modification. This embodiment is advantageous because the processing depth and the refractive index are parameters that have substantial effects on the precision of the focus point thereby created.

According to another preferred embodiment, an additional or alternative parameter is the degree of doping of the solid-state material, which is preferably determined by analysis of backscattered light (preferably Raman scattering), wherein the backscattered light has a different wavelength or a different wavelength range than the incident light defined for triggering the backscattering, such that a Raman instrument is a component of the device, and the degree of doping is determined by means of the Raman instrument, such that one or more or all of these parameters are preferably detected by means of a shared detection head, in particular being detected simultaneously. Raman spectroscopy is preferably also used on glass, sapphire and aluminum oxide ceramics. The Raman method is advantageous because it performs measurements in the depth of a material but only from one side, does not require a high transmittance and outputs the charge carrier density/doping, which can be correlated with the laser parameters, by means of a fit to the Raman spectrum.

The first parameter is determined by means of a refractive index determination means, in particular by means of spectral reflection according to another preferred embodiment of the present invention and/or the second parameter is determined by a topography determination means, in particular by a confocal-chromatic distance sensor.

Data on the parameters, in particular the first parameter and the second parameter, is provided in a data memory device according to another preferred embodiment of the present invention and is sent to a control system at least before creation of the modifications, wherein the control system adjusts the laser processing system as a function of the respective location of the modification to be created. In particular the fluctuations in the refractive index over the semiconductor ingot are not always highly resolved or detectable rapidly enough for real-time control purposes. Therefore, focus guidance with prior knowledge is required. The prior knowledge is represented here by the data on the parameters detected and/or determined and/or generated before the processing and/or creation of the modification.

According to another preferred embodiment of the present invention, the control system for adjusting the laser processing system also processes distance data to yield a distance parameter, wherein the distance parameter represents the distance of the respective location, at which laser beams can be initiated for generating the respective modification in the solid state at the point in time of creation of the modification with respect to the laser processing system, wherein the distance data is detected by means of a sensor device. This embodiment is advantageous because rapid real-time control with the distance sensor and adjustable correction factors can be supplemented by location-dependent control of the correction factors.

According to another preferred embodiment of the present invention, the laser processing system is adjusted by a sensor means, in particular a refractive index determination means and a topography determination means, as a function of a determination of the first parameter and the second parameter during the creation of the modification.

According to another preferred embodiment of the present invention, the solid state is arranged on a receiving device, wherein the receiving device can be moved in X/Y direction or rotated about an axis of rotation, such that the rate of rotation of the receiving device can be varied by means of a drive device as a function of the distance of the location at which the laser beams can penetrate into the solid state from the axis of rotation, preferably increasing with a decrease in the distance from that location, or wherein the receiving device can rotate about the axis of rotation at more than 100 revolutions per minute, preferably at more than 1000 revolutions per minute and especially preferably at more than 1500 revolutions per minute, and laser beams can be emitted by the laser processing system at a frequency of at least 0.5 MHz, preferably of at least 1 MHz, and especially preferably of at least 5 MHz or 10 MHz for generating the modifications.

According to another preferred embodiment of the present invention, the laser beams penetrate into the solid state over a surface area of the portion of the solid state to be removed, wherein the portion of the solid state to be removed has a smaller average thickness than the remaining solid state.

According to another preferred embodiment of the present invention, an additional or alternative parameter is the degree of doping of the solid state at a predetermined location or in a predetermined region, in particular in the interior of the solid state, in particular at a distance from the solid-state surface. The degree of doping is preferably linked to location information, such that a therapeutic map is generated and/or spatially resolved treatment instructions are provided, which predetermine the laser parameters, in particular the laser focus and/or laser energy and/or other machine parameters, in particular the rate of advance as a function of the location.

According to another preferred embodiment of the present invention, the degree of doping is determined by analysis of backscattered light within elastic scattering (Raman scattering) wherein the backscattered light has a different wavelength or a different wavelength range than incident light defined for triggering the backscattering, wherein the backscattered light is backscattered from the predefined location or from the predetermined region.

This embodiment is advantageous because the process must be guided in a locally adapted manner in the laser method, in particular on SiC (but also other materials) (for example, a different laser energy, etc.). It has been recognized according to the invention that in the case of SiC, for example, the doping in particular is crucial here because this alters the transparency of the material for the processing wavelength and necessitates higher laser energies.

According to another preferred embodiment of the present invention, the degree of doping is determined by ellipsometric measurement (for example, Müller matrix ellipsometry with rear side reflection). The ellipsometric measurement is preferably based on optical transmission of the material.

According to another preferred embodiment of the present invention, the degree of doping is determined by a transmission measurement that is calibrated purely optically, wherein the calibration is performed by a Hall measurement and a 4-point measurement. This method is also capable of determining the doping/number of free charge carriers in the material, which then makes it possible to determine the laser energy required for the process.

According to another preferred embodiment of the present invention, the degree of doping is determined by means of an eddy current measurement, wherein differences in conductivity in the solid-state material are preferably determined and evaluated.

In eddy current measurements and/or when using eddy current sensors and/or eddy current measurement technology, a transceiver coil is preferably used to detect local differences in conductivity. A high-frequency primary electromagnetic alternating field is generated in the transmission coil. Then eddy currents (currents flowing locally) are induced in the conductive material, and these in turn induce a secondary electromagnetic alternating field directed in the opposite direction. The superpositioning of these fields can be measured, separated and analyzed. Various quality features (layer thickness, layer resistance, homogeneity of the material) of mainly thin conductive layers but also of bulk material can be measured in this way. In the transmission arrangement (test body between the transceiver coil), optimum approaches are achieved, but an arrangement of the two coils on one side of the sample is also possible for reflection measurements. Different depths of penetration and sensitivities can be utilized thanks to the adapted design of the coils and the choice of frequency.

Therefore there are fundamentally several measurement methods with which the doping can be measured in principle. A rapid, non-contact and non-destructive method is important here.

Furthermore, the present invention relates to a method for separating at least one solid-state layer from a solid state. The method according to the invention comprises at least one of claims 1 through 8. Furthermore, the method according to the invention comprises the creation of so many modifications in the solid state that the solid-state layer becomes detached due to the modification created, or the method according to the invention comprises the steps of arranging or creating a receiving layer on the solid state, wherein the receiving layer comprises, contains or consists of a polymer material, in particular polydimethylsiloxane or an elastomer or an epoxy resin or a combination thereof, and the polymer material undergoes a glass transition due to thermal exposure of the receiving layer for creation of crack propagation stresses in the solid state, in particular mechanical stresses, wherein a crack propagates in the solid state along the crack guidance region due to the crack propagation stresses.

According to another preferred embodiment of the present invention, the receiving layer comprises or consists at least mostly and preferably completely of a polymer material, based on weight, wherein the glass transition of the polymer material occurs between −100° C. and 0° C., in particular between −85° C. and −10° C. or between −80° C. and −20° C. or between −65° C. and −40° C. or between −60° C. and −50° C.

The receiving layer preferably contains or consists of a polymer-hybrid material, which especially preferably forms a polymer matrix, wherein the polymer matrix contains a filler, such that the polymer matrix is preferably a polydimethylsiloxane matrix and the amount by weight of the polymer matrix in the polymer-hybrid material preferably amounts to 80% to 99% and especially preferably 90% to 99%. The receiving layer is preferably supplied as a prefabricated film and is connected to the solid state, in particular by adhesion or bonding.

Therefore, according to the invention a polymer-hybrid material is provided for use in a splitting method, in which at least two solid-state pieces are created from a solid-state starting material. The polymer-hybrid material according to the invention comprises a polymer matrix and at least one first filler embedded therein. Inasmuch as the following discussion relates to a/the filler, the possibility of a plurality of fillers should also be taken into account at the same time. For example, the filler may comprise a mixture of different materials, for example, metal particles and inorganic fibers.

Any polymer or a blend of different polymers may be used as the polymer matrix as long as the stresses required for dividing the solid-state starting material can be created with the help of these polymers. For example, the polymer matrix may be embodied as an elastomer matrix, preferably as a polydiorganosiloxane matrix, especially preferably as a polydimethylsiloxane matrix. Such polymer materials can be used especially easily as the matrix material in combination with fillers because the properties are adjusted in a flexible manner based on the variable degree of crosslinking and can be adapted to the respective filler and to the solid-state starting material that is to be divided. According to one embodiment variant, the amount by weight of the polymer matrix and the polymer-hybrid material is 80% to 99%, preferably 90% to 99%.

The first filler may be of an organic or inorganic nature and may consist of a chemical element as well as a chemical compound or a substance mixture, for example, an alloy.

The first filler is designed so that it acts as a reactant, initiator, catalyst or promoter during separation of the polymer-hybrid material from the solid-state piece after division and therefore results in a more rapid separation of the polymer-hybrid material from the solid-state piece after being divided in comparison with a polymer material without the first filler.

The specific chemical composition and embodiment of the first filler as well as its amount by weight depend in particular on the specific material of the polymer matrix, which is to be separated, the solvent used for this purpose and the reactants used. In addition, the material of the solid-state starting material and the dimensions of the solid-state starting material to be divided also play a role.

The specific amount of the first filler in the polymer matrix depends greatly on the material of the filler and its mechanism of action. Firstly, the polymer matrix must be able to do justice to its object of creating stresses, despite the presence of the filler. Secondly, the amount of the first filler must be great enough to achieve the desired influence on the removal of the polymer. Those skilled in the art can determine the optimum amount by weight of the first filler within the scope of simple experiments conducted as a function of concentration.

To improve the mechanical properties, an additional filler, for example, pyrogenic silica in the form of an inorganic network in the polymer, can also contribute toward an improvement in the mechanical properties. In addition to these strong interactions in the form of the network, weaker interactions can also contribute to the improvement through purely hydrodynamic reinforcement. For example, a targeted increase in viscosity can be mentioned here, permitting improved processing in the splitting method and thus possibly contributing toward improved manufacturing tolerances. In addition, through this interaction, a reduction in the internal degrees of freedom with regard to a structural reorientation is made more difficult with an increase in the reinforcement.

This results in the desired reduction in the glass transition temperature of the polymer used in the polymer-hybrid material, which allows the advantage of a lower temperature in the splitting method. According to the invention, the first filler in a polymer-hybrid material is used to accelerate the release of the polymer-hybrid material from a solid-state piece which is obtained by division by means of a splitting method, in which a solid-state starting material is divided into at least two solid-state pieces.

The first filler may be distributed in the polymer matrix in such a way that the amount by weight of the first filler starting from the outer, i.e., lower, interface of the polymer-hybrid material, which is joined to the solid-state starting material during the splitting process decreases in the direction of another interface in the polymer-hybrid material that is arranged in parallel with the lower interface. This means that the amount by weight of the filler is greater near the solid-state starting material and/or piece than in the other regions of the polymer-hybrid material. This distribution of the first filler permits particularly effective removal of the polymer-hybrid material after separation because the first filler is close to the interface to the solid-state piece and can manifest its effect there. At the same time, the remaining regions of the polymer-hybrid material have fewer or no parts at all of the first filler, so that the function of the polymers is influenced as little as possible.

In one embodiment, the polymer-hybrid material has a layered structure, wherein only one layer facing the solid-state starting material contains the first filler, while the remaining polymer-hybrid material is free of the first filler.

In addition, a lower region of the polymer-hybrid material, which is directly adjacent to its lower interface, may be free of the first filler. This may result in a sequence of regions as follows: next to the solid-state starting material, there is first a region without the first filler, followed by a region with a large amount of the first filler and then a region with a small amount of the first filler or without any of the first filler.

These regions and all the regions described below may be embodied in the form of layers, i.e., the region extends primarily parallel to the interface of the solid-state starting material to which the polymer-hybrid material is applied and has a longitudinal and transverse extent, at least in the region of this interface.

A lower region without the first filler may be provided in particular for the case when the first filler has a negative effect on the adhesion of the polymer-hybrid material to the solid-state starting material. To prevent this, a region without the first filler is arranged first, followed by a region with a large amount of the first filler, so that the first filler can fulfill its function. A lower layer without the first filler may have a thickness between 10 µm and 500 µm, for example, 100 µm.

In addition, an upper region of the polymer-hybrid material, which is directly adjacent to its upper interface, may be free of the first filler. The upper interface is understood to be the interface bordering the polymer-hybrid material on the opposite side from the lower interface and from the solid-state starting material with respect to the surroundings. The upper and lower interfaces may be arranged so they are parallel to one another.

Such an upper region without a first filler may be provided in particular when the first filler has a negative influence on the heat transfer between the surroundings and the polymer-hybrid material, for example, when cooling of the polymer-hybrid material would be delayed.

The first filler may comprise or consist of a material, which can react with a reactant, preferably an oxidizing agent, releasing a gaseous product.

Therefore, cavities which enable more rapid access of the reactants and solvents to the polymer matrix and any sacrificial layer that might be present can be generated in the polymer matrix and they can also result in more rapid removal of reactants and dissolved components.

Additional driving forces which further support the removal of the polymer-hybrid material can be introduced by generating gaseous reaction products.

The design of additional cavities and the formation of gaseous reaction products accelerate the removal of the polymer and therefore contribute to an increase in the total yield of the splitting method. By varying the amount of the first filler, the cavity density can be influenced in a targeted manner in the borderline region between the solid-state piece and the polymer-hybrid material and/or between the sacrificial layer and the polymer-hybrid material.

The first filler may comprise a metal, in particular aluminum, iron, zinc and/or copper, or it may consist of a metal, in particular the aforementioned metals.

"Consisting of" includes all the aforementioned materials, including the fact that technologically induced impurities or additives, which may be useful in the production of the fillers and their distribution in or binding to the polymer matrix may also be present.

Metallic fillers can react with oxidizing agents, such as hydrochloric acid, nitric acid, citric acid, formic acid or sulfamic acid, releasing a gaseous product, and can thereby be removed from the polymer-hybrid material.

For example, aluminum will react with concentrated hydrochloric acid to form solvatized metal ions and hydrogen according to the following equation: $6HCl+2Al+12H_2O \rightarrow 2[AlCl_3.6H_2O]+3H_2$.

Similarly, the reaction of zinc as a filler with concentrated hydrochloric acid leads to the formation of 5 additional cavities: $Zn+2HCl \rightarrow ZnCl_2+H_2$. In these examples, additional driving forces, which further support the removal of the polymer-hybrid material, are introduced by the creation of hydrogen. Furthermore, the first filler can improve the thermal conductivity within the polymer-hybrid material, for example, in that the first filler has a higher thermal conductivity than the polymer of the polymer matrix. This may be the case, for example, when another example of the case when the first filler includes a metal lies in the improved thermal conductivity within the polymer-hybrid material. The stresses created for the division of the solid-state starting material by means of cooling can be generated more effectively, i.e., more rapidly and with a lower consumption of coolant due to the improved thermal conductivity. This can increase the total yield of the splitting method.

In addition, a second filler may be provided in the polymer-hybrid material to increase the adhesion of the polymer-hybrid material to the solid-state starting material in comparison with a polymer-hybrid material without a second filler. Adhesion is preferably increased in comparison with a polymer material without filler.

For example, the second filler may be a filler that can be activated by plasma. Plasma activation results in new surface species that can be created in such a way that they result in a stronger interaction with the surface of the solid-state starting material, and the adhesion of the polymer-hybrid material is improved as a result.

The type of surface species that can be achieved by the plasma treatment depends primarily on the process management of the plasma process. For example, gases such as nitrogen, oxygen, silanes or chlorosilanes may be added during the plasma treatment, so that polar groups, for example, which can interact more strongly with the surface of the solid-state starting material, may be formed.

The second filler may be distributed in the polymer matrix in such a way that the amount by weight of the second filler increases in the direction of the lower interface. For example, the polymer-hybrid material may contain the second filler only in a region adjacent to the lower interface, wherein the region may also be embodied as a layer in the sense of the aforementioned definition.

This permits the arrangement of the second filler preferably near the interface between the polymer-hybrid material and the solid-state starting material, so that adhesion is improved and therefore a greater transfer of force into the solid-state starting material to be divided is possible. For example, the second filler may comprise a core-shell polymer particle.

The preferred particles are those whose polymer composition differs from that of the polymer matrix of the polymer-hybrid material to the extent that the surface, i.e., the shell of the core-shell particles in particular can be activated to a greater extent, for example, by means of low-temperature plasma.

Examples of this include core-shell particles comprising a polysiloxane core with an acrylate shell or comprising a nanoscale silicate core with an epoxy shell or comprising a rubber particle core with an epoxy shell or comprising a nitrile rubber particle core with an epoxy shell. The second filler may be activatable by means of a low-temperature plasma, for example, a cold plasma. For example, the plasma can be generated by means of dielectric barrier discharge (DBE). This makes it possible to generate electron densities in the range of $10^{14}$ to $10^{16}$ m$^{-3}$. The average temperature of the "cold" non-equilibrium plasma generated by DBE (plasma volume) amounts to approx. 300±40K at ambient pressure. The average temperature of the non-thermal plasma generated by DBE amounts to approx. 70° C. at ambient pressure.

In the DBE treatment, the surface is acted upon, for example, by unipolar or bipolar pulses with pulse durations of a few microseconds to a few times ten nanoseconds and amplitudes in the single-digit to double-digit kilovolt range. No metallic electrodes are to be expected in the discharge space here and therefore no metallic impurities or electrode wear need be expected.

Furthermore, a high efficiency is advantageous because charge carriers need not enter or exit from the electrodes.

Dielectric surfaces can be modified and activated chemically at low temperatures. The surface modification may take place by interaction with and reaction of the surface species due to ion bombardment, for example.

In addition, process gases such as nitrogen, oxygen, hydrogen, silanes or chlorosilanes, e.g., six HyEz, where E=F, Cl, Br, I, O, dogx=0 to 10, z=0 to 10, SiH$_4$, Si(EtO)$_4$ or Me$_3$SiOSiMe$_3$ may be added in a plasma treatment to generate certain chemical groups at the surface, for example. The second filler may additionally be activated by means of a corona-5 treatment, flame treatment, fluorination, ozonization or UV treatment and/or excimer radiation. Due to such activation, for example, polar groups are generated at the surface of the second filler and can interact with the surface of the solid-state starting material and thereby improve the adhesion. In addition, the polymer-hybrid material may also comprise a third filler in comparison with a polymer-hybrid material having a first filler or a polymer-hybrid material having a first filler and a second filler. This third filler has a higher thermal conductivity and/or a higher modulus of elasticity in comparison with the polymer of the polymer matrix.

For example, the modulus of elasticity of the polymer is in the lower single-digit gigapascal range (approx. 1-3 GPa) under low-temperature conditions whereas metallic fillers have a modulus of elasticity in the two-digit to three-digit gigapascal range, for example. With a high filler content accordingly, a percolating filler network is possible, which permits an improved "force input" into the solid-state starting material.

Percolation is influenced to a significant extent by the degree of volume filling of the respective fillers (e.g., 0.1 vol %, 1 30 vol % to 10 vol %, depending on the aspect ratio). With an increase in the initiation of force, the viscoelastic layer buildup of the polymer structure can be submerged and multiple percolation pathways may become effective. Improved heat transfers are also made possible here because there may be improved contact of the fillers with the surface of the solid-state starting material.

Mechanical stability of the polymer-hybrid material is also achieved more rapidly at low temperatures. the standard deviation of the corresponding structural property profiles, such as the stress at break and elongation at break of the polymer-hybrid material is thus lower on the whole and therefore there is an increase in the total yield of the splitting method. The spatially resolved changes in the property profiles (stress peaks in the polymer-hybrid material) and thus in the solid state are smaller, which results in a higher total yield of the splitting method and a better quality of the solid-state pieces thereby produced.

The third filler may cause an improved heat transfer between the surroundings and the polymer-hybrid material as well as a more rapid thermal conduction within the polymer-hybrid material, so that the polymer-hybrid material can be cooled more rapidly and the splitting method can be carried out more rapidly on the whole and therefore more effectively.

Due to an increase in the modulus of elasticity, higher stresses can be created by dividing the solid-state starting material, so that even solid-state starting materials for which a particularly high stress is required can also be divided.

Furthermore, the third filler can also serve to influence the thermal expansion coefficient. The goal here is to achieve the greatest possible difference between the thermal expansion coefficients of the polymer-hybrid material and of the solid-state starting material to be divided in order to be able to generate the required stresses for the division. The third filler preferably has a high thermal expansion coefficient, i.e., an expansion coefficient higher than that of the polymer matrix. For example, the thermal expansion coefficient of the third filler may amount to more than 300 ppm/K.

The third filler may be distributed in the polymer matrix in such a way that the amount by weight of the third filler increases in the direction of the upper interface in order to enable a more rapid heat transfer at the interface with the surroundings in particular.

The third filler may comprise a metal, in particular aluminum, iron, zinc and/or copper, or may consist of one of the aforementioned metals. Metals are characterized in general by a high thermal conductivity and temperature conductivity.

The fillers described (first, second, third fillers) may be present in particulate form in the polymer matrix, wherein the particle size may be in the μm and nm ranges, based on at least one dimension of the particle. In addition to a spherical shape, the filler particles may also have other shapes, for example, they may be shaped like rods or disks.

The filler particles may have any particle size distribution, for example, a monomodal or bimodal distribution, a narrow distribution, in particular a monodisperse distribution, or a broad distribution. The fillers may be physically bonded to the polymer matrix, for example, by embedding them in the polymer network, as well being chemically bonded. In addition, one or more of the fillers described may comprise organic or inorganic fibers, for example, carbon fibers, glass fibers, basalt fibers or aramid fibers, or they may also consist of these fibers if the functions described above are consistent therewith. Optionally another filler may also be added, comprising or consisting of the aforementioned fibers.

Fibers usually have strongly anisotropic properties. Due to a directionally oriented positioning of the fillers in the polymer-hybrid material, there is the possibility of having a targeted influence on the stresses required for division of the solid-state starting material. This can contribute toward an increase in the total yield of the splitting method. There is an additional advantage in the case when an organic or inorganic filler is used as the fiber material with a strongly anisotropic structure due to the fact that this makes it possible to achieve an improvement in the mechanical properties within the polymer-hybrid material.

The fillers that have been described may also comprise or consist of core-shell particles. Additionally or alternatively, another filler comprising or consisting of core-shell particles may also be provided in the polymer-hybrid material.

The use of core-shell polymer particles additionally allows a new design of energy-absorbing mechanisms in addition to an improved activatability, and this can result overall in an increase in the impact strength and breaking strength, in particular an increase in the low-temperature impact strength of the polymer-hybrid material when used in the splitting method and may thus also contribute to a higher total yield of the splitting method. For example, mechanical destruction of a film made of a polymer-hybrid material may occur with a lower probability, so that the possibility of reusing the film can be improved.

As an example, destruction of the film in the splitting method can be prevented by suppressing crack propagation due to core-shell polymer particles and therefore this can open up recycling and reutilization pathways.

The elastomer particles contained therein may undergo a plastic deformation and form cavities so that additional energy can be absorbed. An additional energy uptake can also be compensated by the shear flow of the matrix, which improves the mechanical properties on the whole. Core-shell particles are characterized in that a core, which is usually spherical and is made of one material, may be surrounded by a shell of a second material. The shell may either enclose the core completely or may be permeable. These materials may include inorganic materials, such as metals, or organic materials, such as polymers. For example, two different metals may be combined with one another. However, there is also the possibility of enclosing a core made of a polymer in a shell made of a metal or a second polymer.

Core-shell particles make it possible to combine the properties of the first and second materials. For example, the size and density of the filler particles can be determined over an inexpensive polymer core, while the metallic shell can react as described above. Because of the particle size distribution, which is often monodispersed, the properties of the core-shell particles can also be predicted and adjusted in an accurate manner.

In addition, one or more fillers (first, second and/or third fillers) may comprise or consist of carbon in the form of industrial black (carbon black), graphite, chopped carbon fibers, carbon nanofibers, preferably in the form of carbon nanotubes (CNT), such as multi-walled carbon nanotubes (MWCNT) as well as single-walled carbon nanotubes (SWCNT). Carbon nanotubes are cylindrical graphite layers constructed of different numbers of cylinders.

If these tubes consist of only one cylinder, then they are called single-walled carbon nanotubes (SWCNT). If two or more cylinders are present, the result is either double-walled carbon nanotubes (DWCNT) or multi-walled carbon nanotubes (MWCNT). These may preferably be enclosed concentrically, one inside the other.

According to various embodiment variants, the third filler may comprise or consist of MWCNTs, because they have a particularly high thermal conductivity ($>3000$ $W*(m*K)^{-1}$) and at the same time they have a very high crack resistance in the range of 5-60 GPa. The high mechanical stability is manifested in high crack values, extreme elasticity and a very good durability of the filler.

The basis for this is the strong sp2-hybridized σ-C—C bonds connected to a delocalized p-orbital as a π bond to three neighboring vicinal carbons. Bending up to 90° is possible here.

With SWCNTs even higher energy values can be achieved (modulus of elasticity: 410 GPa to 4150 GPa vs. graphite: 1000 GPa, SWCNT: thermal conductivity approx. 6000 $W*(m*K)^{-1}$).

However, here again, the performance/cost ratio is inferior in comparison with that of MWCNTs. The cylinder diameters of MWCNTs are typically in the range of 1 nm to 100 nm, preferably 5 to 50 nm, with a length of 500 nm to 1000 μm.

According to additional embodiment variants, the third filler may comprise MWCNTs, while at the same time the second and/or first fillers may comprise or consist of carbon black because an improvement in the thermal conductivity (e.g., up to 200 $W*(m*K)^{-1}$) can also be achieved. Since the use of carbon black, for example as a much lower tensile strength with values of <0.4 GPa, a combination of two or more fillers is possible and can lead to an improvement in the total split yield and to an improvement in the overall cost of the splitting method.

The average diameters of the carbon black particles are in the range of 5 nm to 500 nm, preferably 20 nm to 200 nm, especially preferably 40 nm to 100 nm.

In addition, the fillers may comprise or consist of silica, for example, pyrogenic silica. Additionally or alternatively, another filler may be provided, comprising or consisting of silica in the polymer-hybrid material.

Pyrogenic silica may form a three-dimensional network and thereby contribute toward an improvement in the mechanical stability. Therefore, such a filler may provide a targeted adjustment of the mechanical properties of the polymer-hybrid material. One or more of the aforementioned fillers (first, second, third filler) may be made of the same material, if this is consistent with the function attributed to them. For example, both the first and third fillers may comprise or consist of aluminum. As described above, aluminum may be used for generated cavities and thus for accelerating the release of the polymer-hybrid material from the solid-state piece and also to increase the thermal conductivity. Such an embodiment simplifies the production process because it may be sufficient to add only one or two fillers in order to fulfill all the functions.

The first and second fillers as well as optionally any third filler may also consist of different materials. Therefore an individual and thus better adaptation of the filler to the desired function is made possible.

A film according to the invention comprises a polymer-hybrid material as described above. The film may have a thickness of 0.5 to 5 mm, for example.

A polymer-hybrid material according to the invention or a film according to the invention is applied to at least this surface, so as to result in a corresponding composite structure. The applied polymer-hybrid material and/or the applied film are also referred to hereinafter as the receiving layer. The thickness of such a receiving layer may be between 0.5 mm and 5 mm, for example, in particular between 1 mm and 3 mm. The polymer-hybrid material or the film may also optionally be applied to multiple exposed surfaces, in particular two surfaces arranged parallel to one another.

Thermal treatments preferably involve cooling the receiving layer to a temperature below ambient temperature and preferably below 10° C. and especially preferably below 0° C. and more preferably below –10° C. or below –40° C.

Cooling of the receiving layer most preferably takes place in such a way that at least a portion of the receiving layer undergoes a glass transition. The cooling may amount to cooling to below –100° C., which can be achieved by using liquid nitrogen, for example. This embodiment is advantageous because the receiving layer contracts as a function of the change in temperature and/or undergoes a glass transition and the resulting forces are transferred to the solid-state starting material, so that mechanical stresses can be created in the solid state, resulting in triggering of a crack and/or crack propagation, wherein the crack first propagates along the first plane of deployment until the solid-state layer is detached.

In another step, the polymer-hybrid material or the film is removed from the solid-state piece, for example, due to a chemical reaction, a physical separation operation and/or mechanical abrasion.

The operation of releasing the polymer-hybrid material from the solid-state piece can take place at a moderate ambient temperature, for example, in the range of 20° C. to 30° C., preferably in the higher temperature range of 30° C. to 95° C., for example, from 50° C. to 90° C., or even in a lower temperature range between 1° C. and 190° C., for example.

The elevated temperature range may make it possible to shorten a chemical separation reaction based on an increase in the reaction rate, for example, in the case of using a sacrificial layer between the polymer-hybrid material and the solid state. In the case of using a sacrificial layer, the separation may take place in an aqueous solution, advantageously at a pH in the range of 2-6. According to various embodiment variants, the separation process may take place in the form of a treatment with a solution of a suitable apolar solvent, for example, wherein moderate ambient temperatures in the range of 1° C. to 50° C. are preferred and from 20° C. to 40° C. are especially preferred.

One special advantage here is separation without a temperature effect on the film. Advantageous aliphatic and aromatic hydrocarbons can be used here, for example, toluene, n-pentane, n-hexane but also halogenated solvents, such as carbon tetrachloride. Additional forces may also be introduced into the polymer-hybrid material that is to be separated and into the interface to the solid-state piece because a very strong and reversible swelling of the polymer-hybrid material may occur as a result of the solvent treatment, so that the separation is simplified on the whole.

According to additional embodiment variants, a combination with the separation mechanism of the sacrificial layer described above and treatment with a suitable apolar solvent is possible—likewise without any temperature effect on the film.

In addition, the present invention relates to a device for creating modifications in a solid state, wherein a crack guidance region is predefined for guiding a crack for separation of a solid-state portion, in particular a solid-state layer from the solid state. According to the invention, the device preferably includes at least one receiving device for receiving and moving at least one solid state, a laser processing system for emitting a plurality of laser beams in succession, wherein the laser beams are focused and generate a modification, at the focus point, and the control system processes data on at least one first parameter and one second parameter and adjusts the laser processing system continuously as a function of said data, in particular for each modification.

In comparison with the traditional arrangement for an autofocus consisting of a distance sensor and a lens adjustor, the device according to the invention preferably has a control unit, which performs the corrections as a function of user input, sensor signals and/or external data sources.

One problem lies in the machine integration. If corrected real-time control is impossible, the laser head and/or the laser processing system will synchronize the system, preferably with a positioning unit and/or the receiving device. The map of the correction factors and/or the data with respect to the parameters from the characterization that is preferably carried out or actually takes place is preferably registered with the workpiece and/or the solid-state is registered with the machine and then is output as a function of location. Because of the dynamics of the adjustment operations and/or manipulation and/or focus operations, control based on the machine software is no longer suitable because of the access times. It is therefore preferable to use a controller, in particular the control system, which loads suitable lookup tables and/or data representing the parameters for rapid access, in particular before the start of processing.

The device according to the invention thus permits for the first time planar microprocessing of solid states with multiphoton absorption in volume. Planar microprocessing permits processing of substrates and/or solid states having a larger diameter, which cannot be positioned with µm precision and without any risk of tilting. This processing is relevant not only in separating solid-state portions and/or in wafering but also in particular in laser-assisted thinning of wafers. If thin semiconductor wafers or solid-state portions are to be produced efficiently, then planar laser splitting is essential because thin wafers allow only a very minor planarization reserve.

According to a preferred embodiment of the present invention, a first parameter is the average refractive index of the solid-state material, or the refractive index of the solid-state material is in the region of the solid state that is to be traversed by laser beams in order to create a defined modification, and a second parameter is the depth of processing in the region of the solid state that is to be traversed by the laser beams in order to create a defined modification. This embodiment is advantageous because the processing depth and refractive index are parameters, which have substantial effects on the precision of the focus point thereby created.

According to another preferred embodiment of the present invention, a distance sensor means is provided for determining a tilt parameter, wherein the tilt parameter represents the tilt of a solid state with respect to the laser processing system, wherein the distance sensor means outputs distance data, such that the distance data is also processes by the control system for adjusting the laser processing system.

A drive device for removing the receiving device is provided according to another preferred embodiment of the present invention, wherein the control system adjusts the rate of movement of the receiving device as a function of the parameters processed.

The definitions of the terms "bow," "warp," "TTV" and "TIR" are given within the scope of the present invention according to the definitions familiar to those skilled in the art in accordance with the SEMI standard and can be found, for example, at http://www.wafertech.co.uk/_downloads/Wafer-Flatness.pdf.

Use of the terms "essentially" or "substantially" preferably defines a deviation in the range of 1%-30%, in particular of 1%-20%, in particular of 1%-10%, in particular of 1%-5%, in particular of 1%-2%, from the determination that would be made without using this term in all cases in which this term is used in the present invention. Individual representations or all representations of the figures described hereinafter are preferably to be regarded as design drawings, i.e., the dimensions, proportions, functional relationships and/or arrangements resulting from the figure(s) preferably correspond precisely or preferably essentially to those of the device according to the invention and/or the product according to the invention.

According to another preferred embodiment of the present invention, the modifications are generated one after the other in at least one line or one row, wherein the modifications created in a line or row are preferably created at a distance X and a height H, so that a crack propagating between two successive modifications, in particular a crack propagating in the direction of the crystal lattice, the crack propagation direction of which is oriented at an angle W with respect to the plane of detachment, will connect the two modifications to one another. The angle W here is preferably between 2° and 6°, in particular 4°. The crack preferably propagates from the region of a first modification below the center of the first modification toward a region of a second modification above the center of the second modification. The essential relationship here is therefore that the size of the modification can or must be modified as a function of the distance of the modifications and the angle W.

According to another preferred embodiment of the present invention, in a first step the modifications are created on one line and preferably at the same distance from one another. Furthermore, it is conceivable for a plurality of these lines created in the first step to be created. These first lines are especially preferably created in parallel with the direction of crack propagation and preferably in a straight line or in an arc, in particular in the same plane. After creating these first lines, two lines are preferably created for triggering and/or driving preferably subcritical cracks. These second lines are also preferably created in a straight line. The second lines are especially preferably inclined with respect to the first lines, in particular being oriented orthogonally. The second lines preferably extend in the same plane as the first lines or they especially preferably extend in a plane parallel to the plane in which the first lines extend. Then the third lines are preferably created for connecting the subcritical cracks.

In doing so, the control system according to a preferred embodiment of the present invention can process distance data as well as parameters of additional sensor means for adjusting the laser processing system in such a manner that position-dependent control instructions for the laser processing system are calculated from the existing position-dependent measurement data of the distance sensor and additional possible sensor means by performing the calculations according to a computation procedure they or are interpolated between the position-dependent measurement data for position-dependent control of the laser processing system at the locations where no position-dependent measurement data is available. Thus, for example, distance data and sensor data of additional sensor means can be measured only in a small number at points in a short period of time and in a coarse grid, and the other positions on the workpiece are interpolated. The ideal goal is for the workpiece to be characterized with the smallest possible number of measurement points in order then to carry out the laser processing. In this way, this interpolation can take place in a control system of the laser processing system during the processing or a location-dependent processing instruction using any local resolution can be created on another data processing system and then transferred to the control system. This embodiment of the invention is especially advantageous because it is not necessary to detect measurement data for each location that is to be processed on the workpiece to be processed but instead a higher density of processing instructions for the laser processing system can be generated from a few measurement data that can be detected in a shorter period of time. This increases the processing speed on the workpiece on the whole because it is thereby possible to reduce the measurement time.

Furthermore, the subject matter of patent application DE 10 2016 123 679.9, which was filed with the German Patent and Trademark Office on Dec. 7, 2016, is now fully made the subject matter of the present patent application by reference thereto.

Additional advantages, goals and properties of the present invention will now be explained on the basis of the following description of the accompanying drawings, which illustrate devices according to the invention as examples. Elements of the devices according to the invention and methods which correspond at least essentially with regard to their function in the figures can be characterized with the same reference numerals herein, such that these components and/or elements need not be labeled with reference numerals in all the figures or explained. The invention will now be described in greater detail below purely as an example on the basis of the accompanying figures.

Figure 3A:
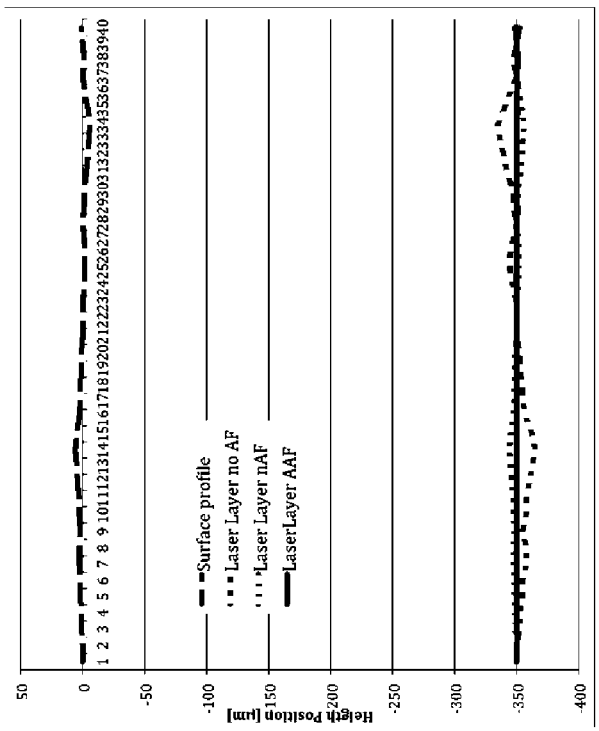
Figure 3B:
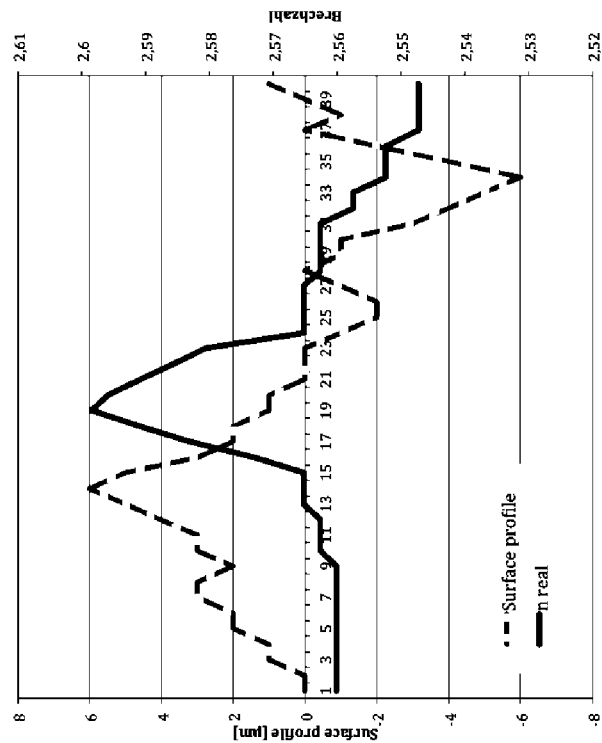
Figure 4B:
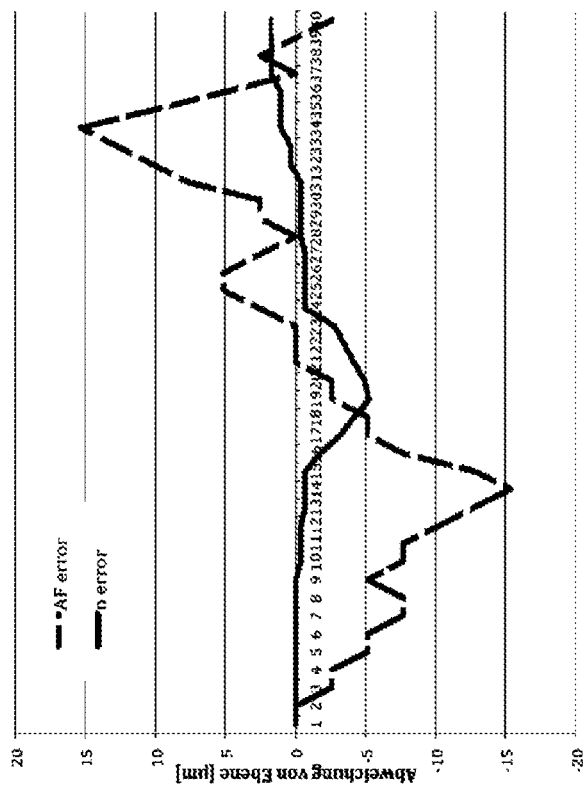
Figure 4A:
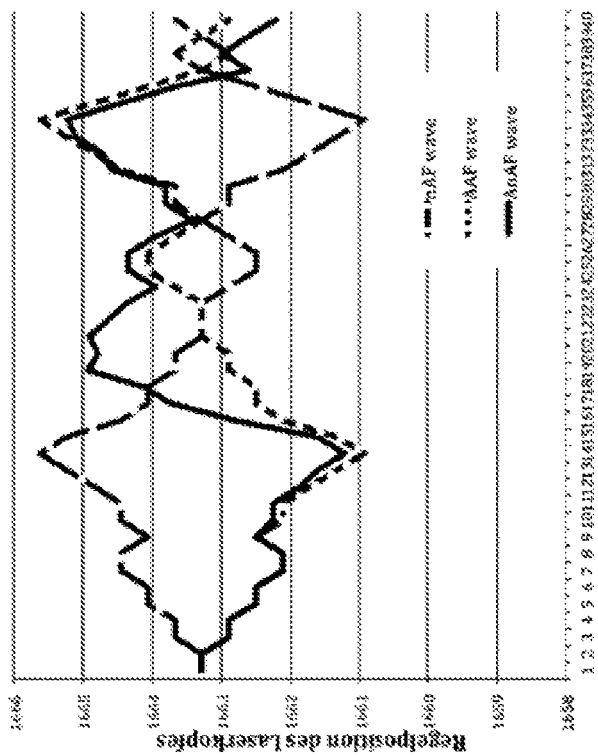
Figure 5A:
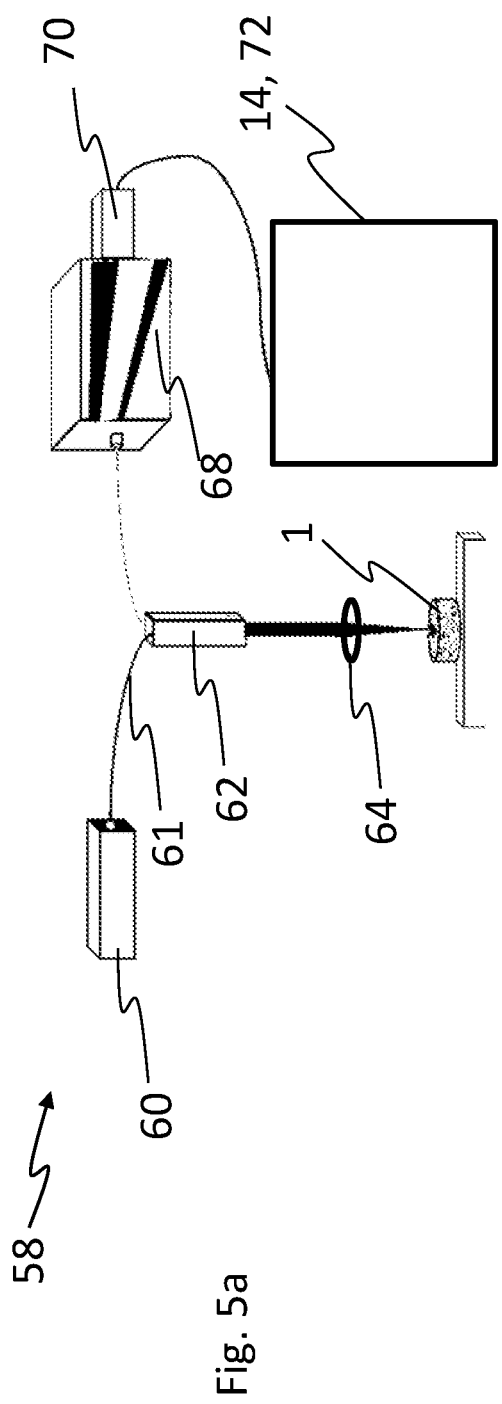
Figure 5B:
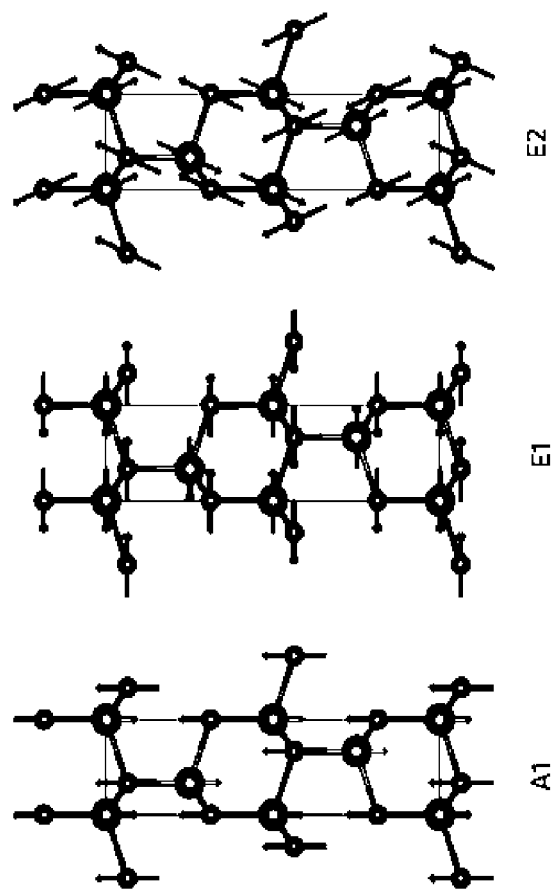
Figure 6A:
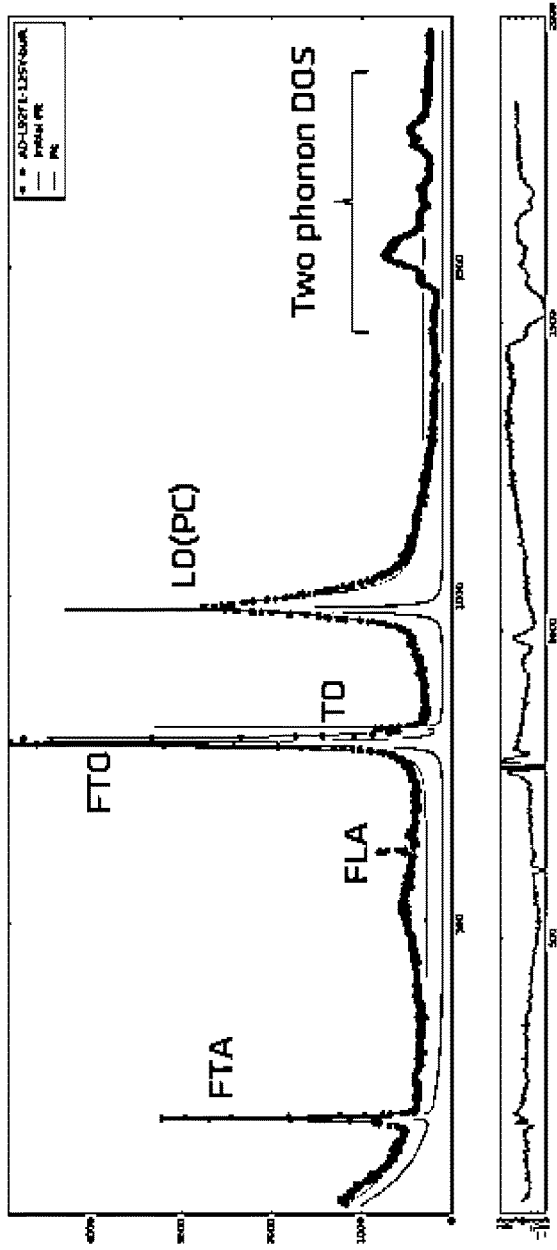
Figure 6B:
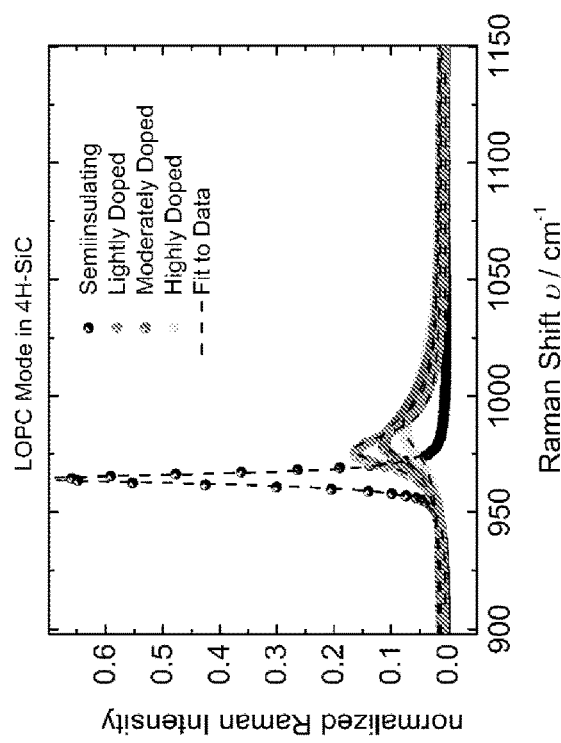
Figure 7A:
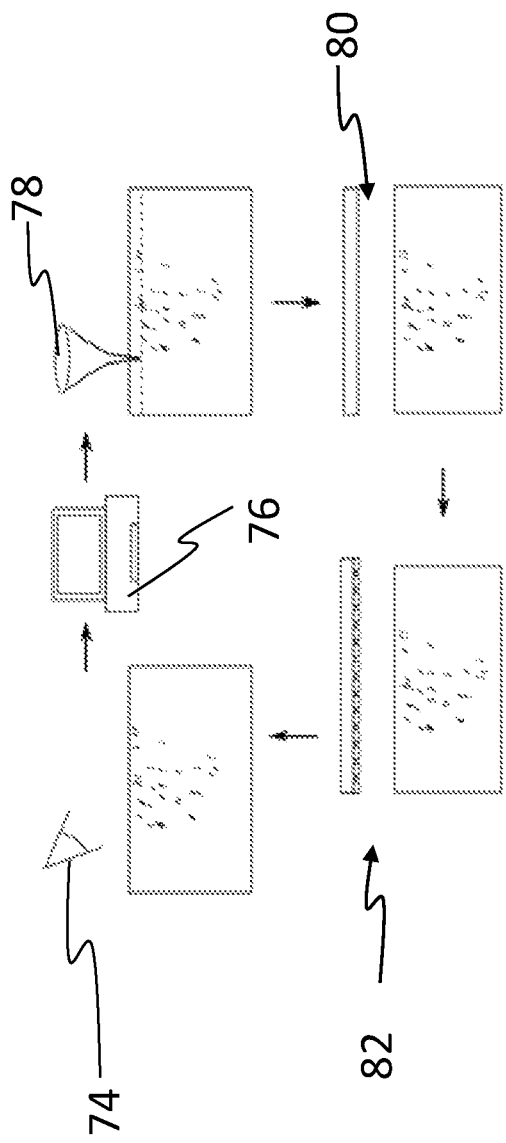

The drawings show:

FIG. 1 an example of a laser processing system according to the invention;

FIG. 2a an example of a device according to the invention;

FIG. 2b the processing of a polymer layer arranged on the solid state using a functional fluid;

FIG. 3a an exemplary diagram of a surface profile of a solid state and the refractive indices of this surface profile;

FIG. 3b several diagrams of surface profiles;

FIG. 4a several diagrams of the changes in control positions of the laser head; and FIG. 4b two curves representing profiles of different modification distributions and FIG. 5a a schematic drawing of a Raman instrument, such as that preferably used according to the invention, in particular such as that which is a preferred component of the device according to the invention;

FIG. 5b various exemplary vibration states of the lattice vibrations of SiC;

FIGS. 6a and 6b two diagrams illustrating doping concentrations in a solid state;

FIG. 7a a feed-forward process according to the invention, and

Figure 7B:
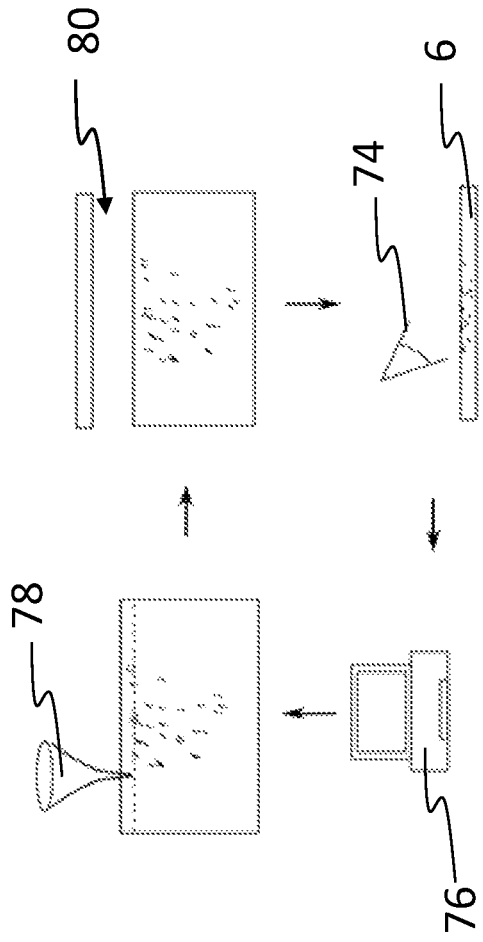

FIG. 7b a feedback process according to the invention.

FIG. 1 shows an laser processing system 8 according to the invention, such as that preferred in the method according to the invention and the device 30 according to the invention for creating modifications 2 in a solid state 1.

The laser processing system 8 here has at least one laser bean source 32, in particular with focus marking. The laser beam source 32 may specifically be a coaxial light source with focus marking. The beams of light 10 generated by the laser beam source 32 are preferably directed on a predetermined path from the laser beam source 32 to a focus device 44 or an adjusting device 44 for adjusting the size of the focus and the position of the focus in the solid state 1. The adjusting device 44 here may preferably be a fine-focusing device, in particular for focusing in Z direction or in the direction of the laser beam. The adjusting device 44 may preferably be designed as a piezo fine-focusing device. The laser beams 10 that pass through the adjusting device 44 preferably pass through a microscope with a long working distance 46. The laser beam is preferably adapted and/or adjusted and/or modified especially preferably by the microscope with the long working distance 46 and the adjusting device 44 in such a way that the modification 2 is created in the predefined location. For example, it is conceivable here for modification 2 to be created at a location which deviates less than 5 μm and preferably less than 2 μm and especially preferably less than 1 μm from the predefined location or is at a distance therefrom. The adjusting device 44 is preferably controlled by a control system 14, wherein the control system 14 preferably calculates and/or determines and/or uses the position and orientation of the solid state 1 with respect to the laser processing system 8 or the distance of the current surface portion into which the laser beam is to be introduced, relative to the laser processing system 8 and the local refractive index or the average refractive index of the solid-state material and the depth of processing of the solid state 1 at the respective location for the adjustment of the laser processing system 8, in particular at least the adjusting device 44. The control system 14 can detect and/or receive the required data in real time through corresponding sensor systems and/or sensor means, which are thus connected to communicate. Alternatively however it is also conceivable for an analysis of the surface over which the laser beams 10 penetrate into the solid state 1 to create the modifications 2 to be performed and/or carried out for one or both of the refractive index and processing depth parameters prior to the start of processing. These parameters can then be stored and/or entered into a memory device, i.e., a data memory 12, in the form of corresponding location-dependent data. The data memory 12 here may be a variable medium, in particular a memory card or a permanently installed memory as part of the laser processing system 8.

Alternatively, however, it is also conceivable for the data memory 12 to be set up outside of the laser processing system 8 and to be connectable at least temporarily so that it can communicate with the laser processing system 8. Additionally or alternatively, work sequences or changes in the work sequence can be preselected for the control system 14 by a user 52. Furthermore, it is also conceivable for the data memory 12 to be embodied as a component of the control system 14. Additionally or alternatively, distance data can be detected by means of a sensor system 16 regarding the distance between the predetermined surface points on the solid state and the laser processing system 8. This distance data is preferably also supplied to the control system 14 for processing.

In addition, it is conceivable for the laser beam processing system 8 to have a camera 34, in particular a coaxial focus camera. The camera 34 is preferably arranged in the direction of the beam path of the laser beams 10 emitted by the laser processing system 8. It is also conceivable here for an optical element 36, in particular a partially transparent mirror, to be arranged in the optical field of the camera 34. The laser beams 10 are preferably fed into the optical field of the camera through the optical element 34.

In addition, it is conceivable that an additional optical element 38 and/or a diffractive optical element, in particular a beam splitter 38 is provided. A portion of the laser beam 10 can be deflected and/or separated from the main beam here by the beam splitter 38. Furthermore the separated and/or deflected portion of the laser beam can be modified by an optional spherical aberration compensation 40 and/or by an optional beam widening 42.

Furthermore, reference numeral 48 denotes a fluid-providing device 48 that is preferably provided, in particular for supplying a cooling fluid. A temperature control, in particular cooling, of the solid state 1 and/or of the microscope can preferably be induced by means of the fluid supply system 48.

Reference numeral 50 denotes a refractive index determination means which can preferably also analyze transparent and reflective surfaces. The refractive index is preferably determined by using the refractive index determination means 50 prior to creation of the modification. Alternatively, it is also conceivable here for the refractive index to be determined on another installation and for the data thereby detected to be supplied to the existing laser processing system 18 by data transfer.

The dotted lines illustrated in FIG. 1 with an arrow preferably characterize data and/or signal transmissions.

FIG. 2a shows schematically a preferred arrangement of the device components, namely the laser processing system 8, the receiving device 18 and the drive and/or traversing device 22 of the device 30. It can be seen that the solid state 1 according to this arrangement is preferably situated between the receiving device 18 and the laser processing system 8. The solid state 1 is preferably glued to the receiving device 18, but it is also conceivable for it to be pressed thereto.

FIG. 2b shows an arrangement after creation of the modifications 2 and/or after complete creation of the crack guidance region 4. According to this illustration, a receiving layer or polymer layer 26 is arranged and/or formed on the surface 24 of the solid state 1, through which the laser beams 10 penetrate into the solid state 1. In addition a functional fluid source is characterized by the device 54 which outputs the functional fluid 56. The functional fluid 56 is preferably liquid nitrogen. Thus the receiving layer 26 is cooled by the functional fluid 56 to a temperature below 20° C., in particular to a temperature below 10° C. or to a temperature below 0° C. or to a temperature below the glass transition temperature of the polymer material of the receiving layer 26. High mechanical stresses are created by the cooling of the receiving layer 26, causing a crack to propagate along the crack guidance region 4. FIG. 3a shows, merely as an example, the relationship between a surface profile of a solid state 1 and the refractive index of the solid-state material. The values shown on the horizontal axis are in units of μm.

FIG. 3b shows examples of deviations of the material to be lasered (surface profile and lateral variations in the refractive index) as well as the laser focus position (no AF: without autofocus, the surface profile is written into the material in inverse ratio, increased by the refractive index, while a standard AF reverses this inversion so that the surface profile is transmitted with an n-fold gain; nAF: this takes into the account the refractive index of the substrate and/or the refractive index as a fixed factor so that the surface profile is thereby transmitted 1:1 into the material. AAF: knowledge of the average refractive index of the substrate and the target depth, the desired advanced autofocus function can write a precisely horizontal plane into the material).

FIG. 4a shows merely as an example various control positions of the laser focus. The values indicated on the horizontal axis are given in units of μm. Thus, the waveform can be determined as a control input variable for the position of the laser head in various cases:

nAF (n-aware AF): the outer focus guide variable of the surface for correcting the average refractive index (n) of the surface. Thus the surface deviation can be transmitted 1:1 into the volume. Therefore, theoretically, the wafer to be split off will not have any fluctuations in thickness (TTV). However, the topography and thus the poor planarity are maintained both for the wafer and for the remaining ingot.

AAF (advanced AF): to correct the autofocus guide variable of the surface with knowledge of the average refractive index of the surface and the correction plane of the surface. It is thus possible to prepare a flat laser plane that prepares the semiconductor crystal to be very flat for additional splits with an inexpensive polishing step. However, the wafer that is split off is flat on one side immediately after the split but has a greater thickness deviation.

AnAF (Advanced n-aware AF): to correct the autofocus guide variable of the surface with knowledge of the local refractive index of the surface and the correction plane of the surface. Thus, a flat laser plane, which prepares the semiconductor crystal to be very flat for additional splits with an inexpensive polishing step, is possible even with heterogeneous samples with prior knowledge.

The present invention thus relates to a method for creating modifications in a solid state, wherein a crack guidance region for guiding a crack for separation of a solid-state component, in particular a solid-state layer from the solid state is predefined by the modification. The method according to the invention here preferably comprises at least the following steps:

Moving the solid state relative to a laser processing system, creating in succession a plurality of laser beams by means of the laser processing system for creating at least one modification, wherein the laser processing system is adjusted for defined focusing of the laser beams continuously as a function of a plurality of parameters, in particular at least two parameters. A planar microfocus for multiphoton material processing in the volume is preferably made possible by the method according to the invention.

FIG. 5a shows a Raman instrument 58. The Raman instrument 58 shown here has a laser 60 for emitting laser rays. The laser rays are preferably sent by means of at least one optical fiber 61 for excitation preferably through a lens and preferably focused by this lens 64 in particular being focused in the solid state. This radiation is at least partially scattered, wherein light components having the same wavelength as the radiation emitted by the laser are preferably filtered out by means of a filter device and/or an exciting filter 62. The other radiation components are then sent to a spectrograph 68 and detected by means of a camera system, in particular a CCD detector 70 and processed and/or analyzed by a control system 14, 72, in particular a computer.

Thus atomic vibrations in the crystal are excited preferably by an external laser or especially preferably by an additional laser. The vibrations are generated by light scattering on crystal atoms, which leads to observable scattered light, which has a photon energy that is altered by the amount of the vibration energy. When there are multiple excitable vibrations, multiple peaks also appear in the spectrum of the scattered light. Then using a spectrometer (grating spectrometer), the resulting Raman scattering spectrum can be investigated in greater detail (so-called Raman spectroscopy). In this method, the local conditions in the crystal are imposed on the individual Raman lines in their shape, and it is possible to deduce the degree of doping by analyzing the shape of the Raman line.

FIG. 5b shows how possible lattice vibrations appear in SiC, wherein these modes are predetermined by crystal symmetry and directions and may also be excited at the same time. The views shown here have one direction along the crystal axis A. Atomic vibrations here are possible only in certain directions, the directions being predetermined by the symmetry of the crystal.

FIG. 6a shows a detail of a Raman diagram of a 4H-silicon carbide solid state doped with nitrogen (example of a Raman spectrum on doped SiC). The shape of the LO(PC) mode is used here for measuring the dopant concentration and is fitted. Bottom panel: fitting residual.

FIG. 6b shows a smaller detail of the Raman spectrum.

As shown here, this yields a direct method for determining the dopant concentration with Raman measurements from a measurement of the shape and subsequent fitting to the LO(PC) mode.

In general, the goal is thus, by adjusting the laser parameters, to adjust the optimum (least possible, shortest possible) path of cracking in the material which will still lead to successful separation due to crack propagation but will otherwise minimize or reduce all loss of material (including that in grinding operations).

FIG. 7a and FIG. 7b show two possibilities for lifting a single wafer from the boule/ingot.

According to FIG. 7a this is embodied as a feed-forward loop and according to FIG. 7b it is embodied as a feedback loop.

In feed-forward, the distribution before the laser process is characterized and then used to calculate a map and/or treatment instructions and/or parameter adjustments, in particular as a function of location, for laser process, in particular for creation of the modification. Feed-forward is preferably carried out on the ingot/boule.

Alternatively, as illustrated in FIG. 7b, a feedback loop may be implemented, so that the resulting wafer is characterized after each separation step and then serves as a template for the next.

Depending on the material and the doping, different adjustments can thus be made during the laser process.

With the SiC material, different adjustments in the laser parameters can be made at different depths as a function of the doping. This can lead to the functions also shown below with the boundary conditions listed below:

Depth 180 μm, pulse duration 3 ns, numerical aperture 0.4
Low doping: 7 μJ-21 mOhmcm
High doping: 8 μJ-16 mOhmcm
Depth 350 μm, pulse duration 3 ns, numerical aperture 0.4
Low doping: 9.5 μJ-21 mOhmcm
High doping: 12 μJ-16 mOhmcm
Formula for a Depth of 180 μm:
E energy in μJ
E0 offset energy at the lowest doping
K energy scaling factor
R measured degree of doping
B basic degree of doping (21 mOhmcm)

$$E = E0 + (B-R)*K$$

where
K=1/(21−16) μJ/mOhmcm=0.2 μJ/mOhmcm
E0=7 μJ
B=21 mOhmcm
Example: measured degree of doping of 19 mOhmcm:
E=7.4 μJ
Formula for 350 μm Depth:
E energy in μJ
E0 offset energy at the lowest doping
K energy scaling factor
R measured degree of doping
B basic degree of doping (21 mOhmcm)

$$E = E0 + (B-R)*K$$

where
K=2.5/(21−16) μJ/mOhmcm=0.5 μJ/mOhmcm
E0=9.5 iμJ
B=21 mOhmcm
Example: measured degree of doping of 19 mOhmcm:
E=10.5 μJ

| List of Reference Numerals |
| --- |
| 1 solid state |
| 2 modification |
| 4 crack guidance region |
| 6 solid-state portion |
| 8 laser processing system |
| 10 laser beam |
| 12 data memory device |
| 14 control system |
| 16 sensor device |
| 18 receiving device |
| 20 axis of rotation |
| 22 drive device |

| -continued |
| --- |
| List of Reference Numerals |
| 24 surface of the solid-state portion to be separated |
| 26 receiving layer |
| 30 device |
| 32 laser beam source |
| 34 camera |
| 36 optical element |
| 38 beam splitter |
| 40 spherical aberration compensation means |
| 42 beam expander |
| 44 adjusting device |
| 46 microscope with a long working distance |
| 48 fluid source |
| 50 refractive index determination means |
| 52 user |
| 54 functional fluid source |
| 56 functional fluid |
| 58 Raman instrument |
| 60 laser |
| 61 optical fiber for excitation |
| 62 excitation filter |
| 64 lens |
| 68 spectrograph |
| 70 CCD detector |
| 72 analysis and/or processing system or control system 14 |
| 74 inspection |
| 76 adjusting of laser parameters and/or machine parameters and generating spatially resolved treatment instructions and/or a spatially resolved treatment map |
| 78 laser process (generating modifications) |
| 80 separation step, in particular by means of crack propagation and crack guidance |
| 82 surface treatment |

The invention claimed is:

1. A method for creating modifications in a solid-state material, wherein a crack guidance region for guiding a crack for separating a solid-state layer from the solid-state material is predetermined by the modifications, the method comprising:
   moving the solid-state material relative to a laser processing system;
   successively emitting a plurality of laser beams from the laser processing system to the solid-state material to create at least one modification within the solid-state material; and
   continuously adjusting the laser processing system for defined focusing of the plurality of laser beams and/or for adjustment of energy of the plurality of laser beams as a function of at least one parameter,
   wherein the at least one parameter for adjusting the laser processing system includes a degree of doping of the solid-state material at a predetermined location or in a predetermined region.

2. The method of claim 1, further comprising:
processing distance data regarding a distance parameter for adjusting the laser processing system, wherein the distance parameter represents a distance with respect to the laser processing system, wherein the plurality of laser beams is introduced into the solid-state material at a point in time of creation of the at least one modification, and wherein the distance data is detected by means of a sensor device.

3. The method of claim 1, further comprising:
determining the degree of doping by analysis of backscattered light with an inelastic (Raman) scattering, the backscattered light having a different wavelength or a different wavelength range than incident light defined for triggering the backscattering, wherein the backscattered light is backscattered from the predefined location or from the predetermined region.

4. The method of claim 1, further comprising:
determining the degree of doping by an eddy current measurement, wherein differences in conductivity are determined in the solid-state material.

5. The method of claim 1, further comprising:
determining the degree of doping by ellipsometric measurement.

6. The method of claim 5, wherein the ellipsometric measurement is based on optical transmission of the solid-state material.

7. The method of claim 1, further comprising:
determining the degree of doping by Müller matrix ellipsometry with rear side reflection.

8. The method of claim 1, further comprising:
determining the degree of doping by a transmission measurement that is calibrated optically.

9. The method of claim 8, wherein the optical calibration is performed by a Hall measurement and a 4-point measurement.

10. The method of claim 8, further comprising:
determining a doping/number of free charge carriers in the solid-state material by the transmission measurement.

* * * * *